(12) United States Patent
Lee

(10) Patent No.: US 6,917,324 B2
(45) Date of Patent: Jul. 12, 2005

(54) SIGNAL PROCESSOR AND APPARATUS AND METHOD FOR TESTING SAME

(75) Inventor: Sang-Hyeon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/852,937

(22) Filed: May 25, 2004

(65) Prior Publication Data

US 2005/0030209 A1 Feb. 10, 2005

(30) Foreign Application Priority Data

Aug. 4, 2003 (KR) ................................ 10-2003-0053909

(51) Int. Cl.[7] .............................................. H03M 1/12
(52) U.S. Cl. ...................................... 341/155; 341/143
(58) Field of Search ................................ 341/155, 143, 341/144, 145, 139, 118, 120, 172

(56) References Cited

U.S. PATENT DOCUMENTS 3,683,369 A * 8/1972 Stern .......................... 341/169
6,037,887 A * 3/2000 Wu et al. .................... 341/143
6,184,811 B1 * 2/2001 Nagari et al. ............... 341/143

* cited by examiner

*Primary Examiner*—Peguy JeanPierre
*Assistant Examiner*—Joseph Lauture
(74) *Attorney, Agent, or Firm*—Mills & Onello LLP

(57) ABSTRACT

An apparatus for testing a signal processor includes an integrator and a control section. The integrator switches an input signal in response to a first clock signal to allow the input signal to be charged in at least one capacitive element, and outputs the charged input signal in response to a second clock signal. The control section is coupled to the integrator, and provides the integrator with a control signal to discharge the capacitive elements based on a level of the input signal at a previous part of a test mode. The time required for testing the signal processor is reduced.

12 Claims, 9 Drawing Sheets

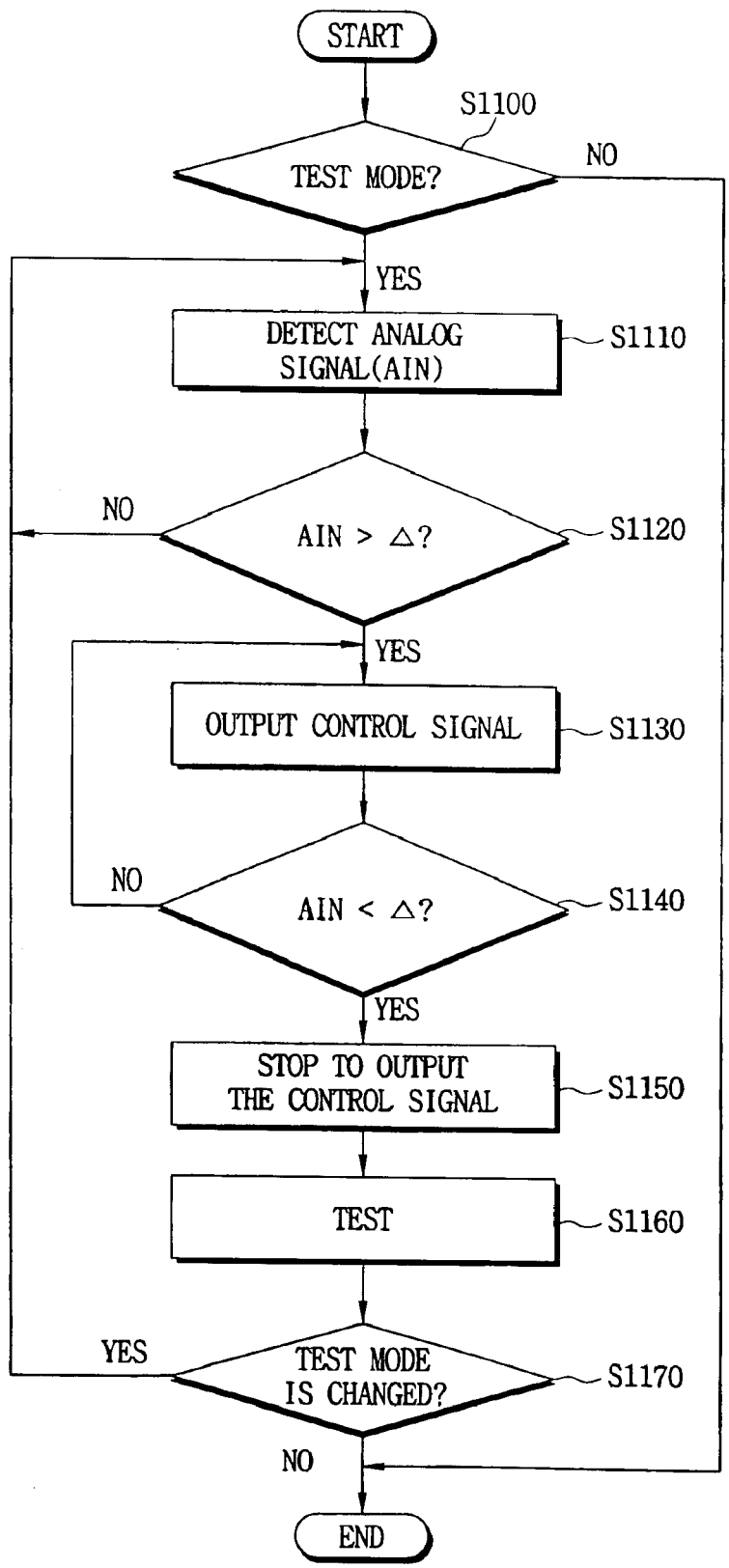

SIGNAL PROCESSOR AND APPARATUS AND METHOD FOR TESTING SAME

CROSS-REFERENCE TO RELATED APPLICATIONS

This application relies for priority upon Korean Patent Application No. 2003-53909 filed on Aug. 4, 2003, the contents of which are herein incorporated by reference in their entirety.

BACKGROUND OF THE INVENTION

1. Field of the Invention

The present invention relates to a signal processor and an apparatus and method for testing the signal processor.

2. Description of the Related Art

FIG. 1 is a schematic diagram of an integrator circuit. As shown in FIG. 1, the integrator circuit includes an input terminal which receives an input signal Vi to be integrated by the circuit and an output terminal at which the integrated output signal Vo is output from the circuit. Generally, an integrator circuit includes an operational amplifier (op amp) 100, a resistor R connected between the input terminal of the integrator circuit and an inverting terminal of the op amp 100, and a capacitor C connected between the inverting terminal of the op amp 100 and an output terminal of the op amp 100.

The resistance of the resistor R may vary within about 20% of a desired resistance, and the capacitance of the capacitor C may vary within about 10% of a desired capacitance. The error rate of the resistor R and capacitor C is inadequate when the integrator is used in controlling a small or low-level signal.

To solve this problem, a switched capacitor has been used in the integrator. In the switched capacitor, a capacitor and switches replace the resistor R. The switched capacitor integrator may accurately control a low-level signal to output precise results because the error rate of the capacitor is smaller than the error rate of the resistor.

FIG. 2 is a schematic diagram of a switched capacitor integrator circuit. As shown in FIG. 2, the switched capacitor integrator includes an operational amplifier 200, first and second capacitors C1 and C2, switches S1, S2, S3 and S4.

The first capacitor C1 is connected through a switch S2 to an inverting (−) terminal of the op amp 200. First and second switches S1 and S2 are serially connected to first and second ends, respectively, of the first capacitor C1 to thereby allow an input signal to be applied to the inverting (−) terminal of the op amp 200. The third and fourth switches S3 and S4 are connected in parallel to first and second ends, respectively, of the first capacitor to thereby allow a DC reference voltage (Vcom) to be applied to the first capacitor C1. The DC reference voltage (Vcom) is a reference signal for the input signal (Vi). The second capacitor C2 is connected between the inverting (−) terminal and the output terminal of the operational amplifier 200.

FIG. 3 is a timing diagram illustrating timing of two clock signals P1 and P2 used to control the opening and closing of the switches S1, S2, S3 and S4. Referring to FIG. 3, the first, second, third and fourth switches S1, S2, S3 and S4 are turned on/off in response to the first and second clock signals P1 and P2 of FIG. 3. The active status of the first clock signal P1 does not overlap with the active status of the second clock signal P2. The active status of each of the first and second clock signals is alternately repeated as shown in FIG. 3.

The first and third switches S1 and S3 are turned on, i.e., closed, during the active status of the first clock signal P1, and thus the input signal Vi charges the first capacitor C1 during the active status of P1. The second and fourth switches S2 and S4 are turned on during the active status of the second clock signal P2, and thus the charge at the first capacitor C1 is applied to the inverting (−) terminal of the op amp 200 during the active status of P2.

The quantity of the charge applied to the op amp 200 during one period of the first and second clock signals P1 and P2 is substantially constant, and therefore, the capacitor C1 and switches S1, S2, S3 and S4 restrict the movement of the charge, in similar fashion to the resistor R of FIG. 1.

The switched capacitor integrator is used, for example, in a voice codec (coder/decoder), which converts an analog signal to a digital signal, or vice versa. The voice codec can be used in a mobile communication device.

Particularly, the switched capacitor integrator can be used in the analog sigma-delta modulator or an analog filter of the voice codec.

FIG. 4 is a schematic circuit diagram showing a conventional analog sigma-delta modulator.

Referring to FIG. 4, the analog sigma-delta modulator includes a first switched capacitor integrator 400, a second switched capacitor integrator 410 and a comparator 420. The first and second switched capacitor integrators 400 and 410 include a plurality of switches and a plurality of capacitors. The switches are turned on/off in response to the first and second clock signals P1 and P2 of FIG. 3. The capacitors are charged and discharged according to the switching operation of the switches. In addition, the conventional analog sigma-delta modulator may include a digital-to-analog converter that feeds back the signal VREF_TOP or VREF_BOT to the first and second switched capacitor integrators 400 and 410.

The voice codec having the above analog sigma-delta modulator usually has three input lines to which a test signal can be applied. The output signal of the voice codec is compared with predetermined signals so as to test the operation of the voice codec.

When an analog test signal is applied to a first input line, the analog test signal is converted to a digital signal by the sigma-delta modulator of FIG. 4. The output of the sigma-delta modulator of FIG. 4 is used to test the operation of the voice codec.

When an analog test signal is applied to a second input line, the sigma-delta modulator of FIG. 4 outputs a digital signal converted from the analog test signal after considerable time delay. After the test signal is applied to the first input line, charges are accumulated at the capacitors of the sigma-delta modulator of FIG. 4, and then the test signal is applied to the second input line while charges are accumulated at the capacitors of the sigma-delta modulator of FIG. 4, to thereby cause the time delay.

Wait time is required in order to discharge the capacitors, and thus wait time is calculated. Then, the test signal is applied to the second input line after the lapse of the wait time.

However, the capacitors of the conventional analog sigma-delta modulator or analog filter are discharged slowly in response to a clock signal, so the time for discharging the capacitors can be considerable.

Therefore, considerable time delay is caused in testing the voice codec having a plurality of input lines.

SUMMARY OF THE INVENTION

Accordingly, the present invention is provided to substantially obviate one or more problems due to limitations and disadvantages of the related art.

It is a first feature of the present invention to provide a signal processor capable of being tested without time delay.

It is a second feature of the present invention to provide an apparatus for testing the signal processor without time delay.

It is a third feature of the present invention to provide a method of testing the signal processor without time delay.

In one aspect of the present invention, there is provided a signal processor including a first converter, a first filter and a control section. The first converter integrates a first analog signal to output a first digital signal corresponding to the integrated first analog signal. The first converter includes a plurality of switches and a plurality of capacitive elements coupled to the switches. The switches are switched in response to at least one clock signal. The first filter is coupled to the first converter and filters the first digital signal. The control section provides the first converter with a control signal for discharging the capacitive elements when a test mode signal is received.

In one embodiment, the first converter includes: a first integrator for integrating the first analog signal; a second integrator for integrating an output of the first integrator; and a comparator for converting an output of the second integrator to the first digital signal. The first integrator can include: a first operational amplifier; a first capacitive element coupled to a first input terminal of the first operational amplifier and an output terminal of the first operational amplifier; a second capacitive element coupled to the first input terminal of the first operational amplifier; first and second switches serially coupled to first and second ends, respectively, of the second capacitive element, the first and second switches being turned on in response to the control signal; and third and fourth switches, coupled in parallel to first and second ends, respectively, of the second capacitive element, the third and fourth switches being turned on in response to the control signal to discharge the first and second capacitive elements. The second integrator can include: a second operational amplifier; a third capacitive element coupled to a first input terminal of the second operational amplifier and an output terminal of the second operational amplifier; a fourth capacitive element coupled to the first input terminal of the second operational amplifier; fifth and sixth switches serially coupled to first and second ends, respectively, of the fourth capacitive element, the fifth and sixth switches being turned on in response to the control signal; and seventh and eighth switches coupled in parallel to first and second ends, respectively, of the fourth capacitive element, the seventh and eighth switches being turned on in response to the control signal to discharge the third and fourth capacitive elements.

The control section may include a reference signal generator and a control signal generator. The reference signal generator may generate at least one reference signal that has predetermined amplitude with respect to a ground level of the first analog signal. The control signal generator may compare the reference signal with the first analog signal to output the control signal when a level of the first analog signal is higher than a threshold level, and to stop outputting the control signal when the level of the first analog signal is lower than or equal to the threshold level.

In one embodiment, the at least one reference signal includes: a first reference signal having a first level higher than a DC reference voltage by the threshold level, the DC reference voltage corresponding to the ground level of the first analog signal; a second reference signal having a second level higher than the first reference signal by the threshold level; a third reference signal having a third level lower than the DC reference voltage by the threshold level; and a fourth reference signal having a fourth level lower than the third reference signal by the threshold level. The control signal generator can include: a first comparator having a first input terminal through which the second reference signal is inputted, and a second input terminal through which the first analog signal is inputted; a second comparator having a second input terminal through which the first reference signal is inputted and a first input terminal through which the first analog signal is inputted; a third comparator having a second input terminal through which the fourth reference signal is inputted and a first input terminal through which the first analog signal is inputted; a fourth comparator having a first input terminal through which the third reference signal is inputted and a second input terminal through which the first analog signal is inputted; a first AND gate for performing a logical AND operation on outputs of the first and second comparators; a second AND gate for performing the logical AND operation on outputs of the third and fourth comparators; an OR gate for performing a logical OR operation on outputs of the first and second AND gates; and a third AND gate for performing the logical AND operation on an output of the OR gate and the test mode signal to output the control signal.

In one embodiment, the signal processor further includes: a second converter for converting a second digital signal into a second analog signal; and a second filter, coupled to the second converter, for filtering the second analog signal.

The second filter can include: an operational amplifier; a first capacitive element coupled to a first input terminal of the operational amplifier and an output terminal of the operational amplifier; a second capacitive element coupled to the first input terminal of the operational amplifier; first and second switches serially coupled to first and second ends, respectively, of the second capacitive element, the first and second switches being turned on in response to the control signal; and third and fourth switches coupled in parallel to first and second ends, respectively, of the second capacitive element, the third and fourth switches being turned on in response to the control signal to discharge the first and second capacitive elements.

The signal processor can further include: a clock signal generator for providing the first converter with first and second clock signals when the control signal is not provided to the first converter, the first clock signal selectively turning on first switches of the switches to charge at least one of the capacitive elements, and the second clock signal selectively turning on second switches of the switches to amplify charges of the capacitive elements.

In another aspect, the invention is directed to a signal processor including an integrator and a control section. The integrator switches an input signal in response to a first clock signal to allow the input signal to charge at least one capacitive element, and outputs the charged input signal in response to a second clock signal. The control section may be coupled to the integrator, and may provide the integrator with a control signal to discharge the capacitive element based on a level of the input signal at an previous part of a test mode.

The control section may output the control signal when the level of the input signal is higher than a threshold level, and stops outputting the control signal when the level of the input signal is lower than or equal to the threshold level.

In another aspect, the present invention is directed to an apparatus for testing a signal processor including a plurality of switches and a plurality of capacitive elements operated in response to at least one clock signal. The signal processor converts a first analog signal to a first digital signal or converts a second digital signal to a second analog signal. The apparatus includes a reference signal generator and a control signal generator. The reference signal generator generates at least one reference signal that has predetermined amplitude with respect to a ground level of the first analog signal. The control signal generator compares the reference signal with the first analog signal to output a control signal when a level of the first analog signal is higher than a threshold level, and to stop outputting the control signal when the level of the first analog signal is lower than or equal to the threshold level. The switches are operated in response to the control signal so that the capacitive elements are discharged in response to the control signal.

The reference signal can include: a first reference signal having a first level higher than a DC reference voltage by the threshold level, the DC reference voltage corresponding to the ground level of the first analog signal; a second reference signal having a second level higher than the first reference signal by the threshold level; a third reference signal having a third level lower than the DC reference voltage by the threshold level; and a fourth reference signal having a fourth level lower than the third reference signal by the threshold level. The control signal generator can include: a first comparator having a first input terminal through which the second reference signal is inputted and a second input terminal through which the first analog signal is inputted; a second comparator having a second input terminal through which the first reference signal is inputted and a first input terminal through which the first analog signal is inputted; a third comparator having a second input terminal through which the fourth reference signal is inputted and a first input terminal through which the first analog signal is inputted; a fourth comparator having a first input terminal through which the third reference signal is inputted and a second input terminal through which the first analog signal is inputted; a first AND gate for performing a logical AND operation on outputs of the first and second comparators; a second AND gate for performing the logical AND operation on outputs of the third and fourth comparators; an OR gate for performing a logical OR operation on outputs of the first and second AND gates; and a third AND gate for performing the logical AND operation on an output of the OR gate and the test mode signal to output the control signal.

In another aspect, the present invention is directed to a method of testing a signal processor including a plurality of switches and a plurality of capacitive elements coupled to the switches. The method includes i) judging whether a test request signal for testing the operational status of the signal processor is received, ii) discharging the capacitive elements when the test request signal is received, and iii) testing the operational status of the signal processor using an analog signal.

For example, the capacitive elements may be discharged by i) detecting whether a level of the analog signal is higher than a threshold level, ii) discharging the capacitive elements when the level of the analog signal is higher than the threshold level, and iii) stopping discharging the capacitive elements when the analog signal is lower than or equal to the threshold level.

The testing can include: converting the analog signal into a digital signal using the switches and the capacitive elements operated in response to the first and second clock signals; and comparing a predetermined signal corresponding to the analog signal with the digital signal to test the operational status of the signal processor.

According to the present invention, the apparatus for testing the signal processor includes the switched capacitor integrator having a plurality of switches and a plurality of capacitors. The switches are turned on in response to the control signal generated during the test mode to be connected to the DC reference voltage Vcom.

The switches are connected to the DC reference voltage Vcom by the control signal when the level of the analog signal for testing the signal processor is higher than the threshold level ($\Delta$), to thereby discharge the capacitors.

Thus, wait time is not required in order to discharge the capacitors. The control signal is no longer outputted when the level of the analog signal for testing the signal processor is lower than the threshold level ($\Delta$), and then the test operation begins. Therefore, the time required for testing the signal processor may be reduced, and the signal processor may be tested without time delay.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

FIG. 11 is a flow chart illustrating an exemplary method of testing an audio processor in accordance with the present invention.

DESCRIPTION OF EMBODIMENTS OF THE INVENTION

Figure 1:
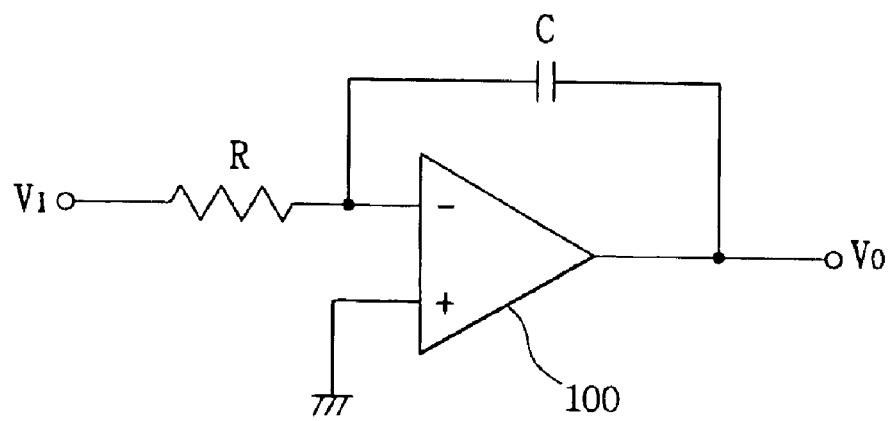
FIG. 1 is a schematic circuit diagram illustrating a conventional integrator circuit.
Figure 2:
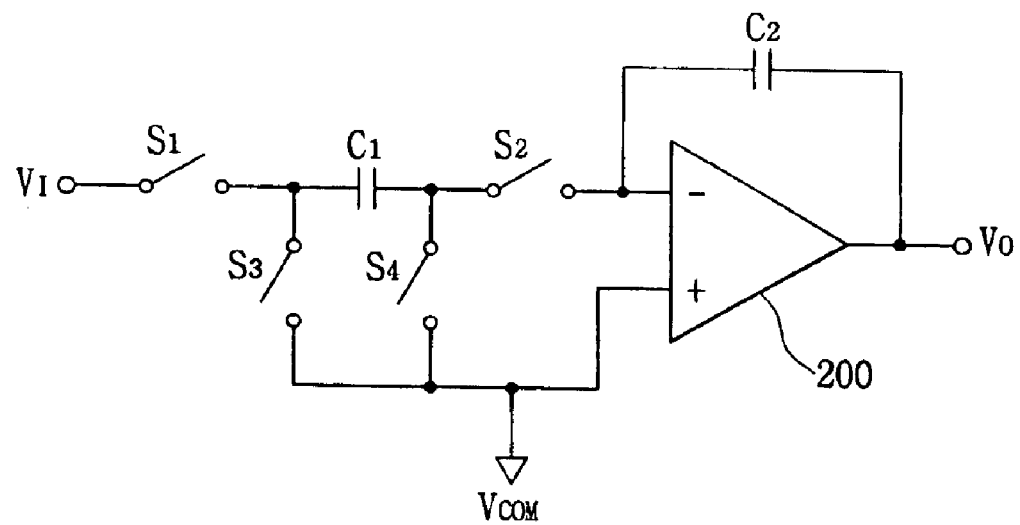
FIG. 2 is a schematic circuit diagram illustrating a conventional switched capacitor integrator circuit.
Figure 3:
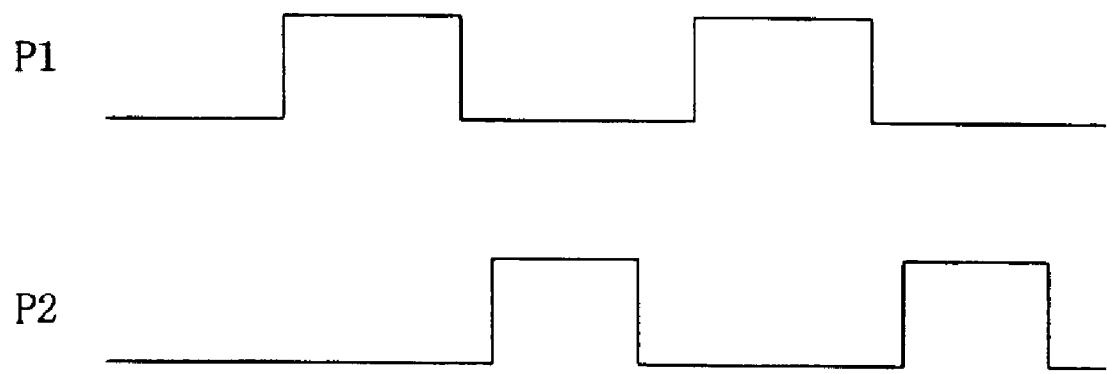
FIG. 3 is timing diagram showing clock signals for driving the switched capacitor integrator of FIG. 1.
Figure 4:
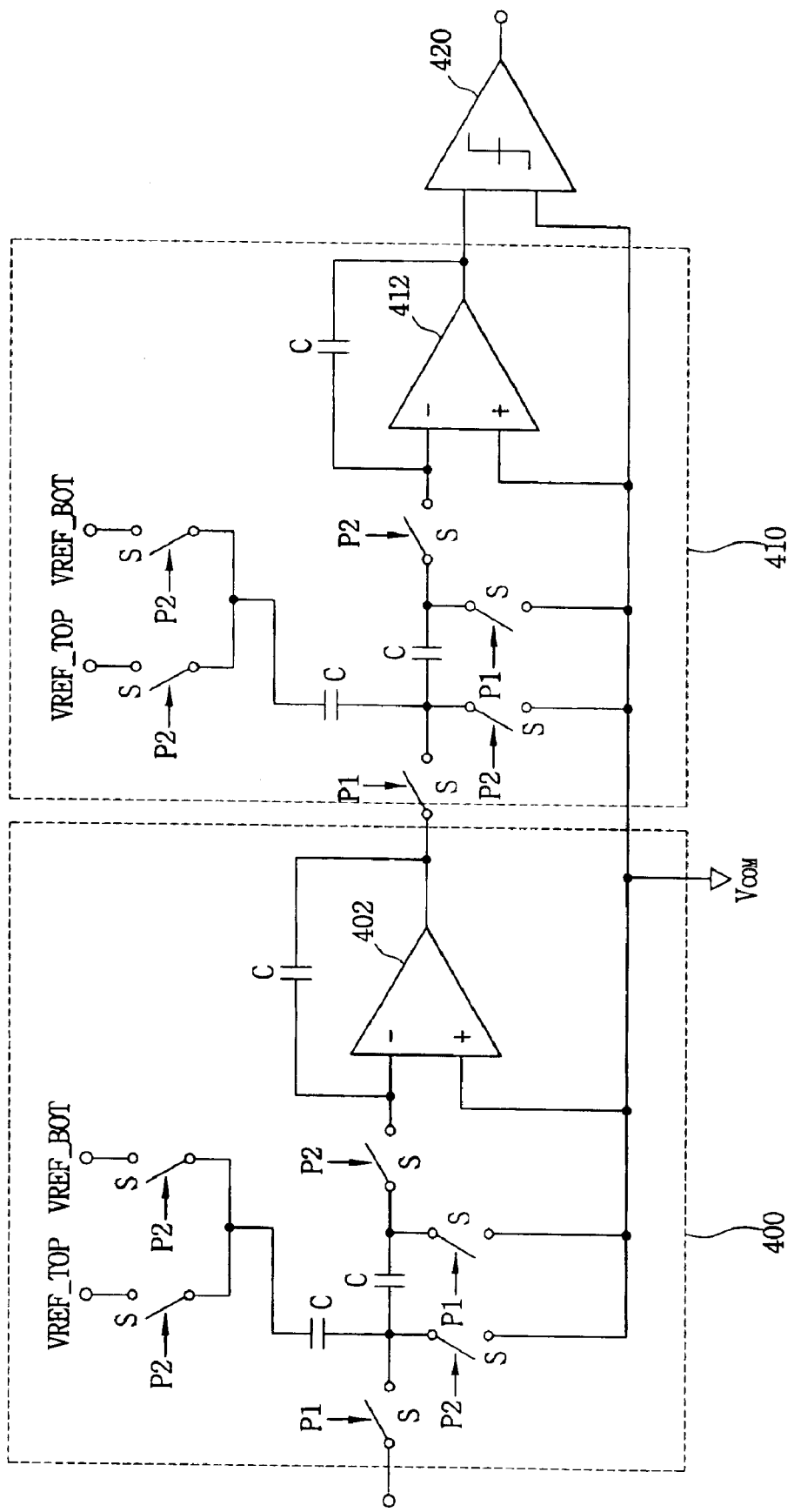
FIG. 4 is a schematic circuit diagram illustrating a conventional analog sigma-delta modulator.
Figure 5:
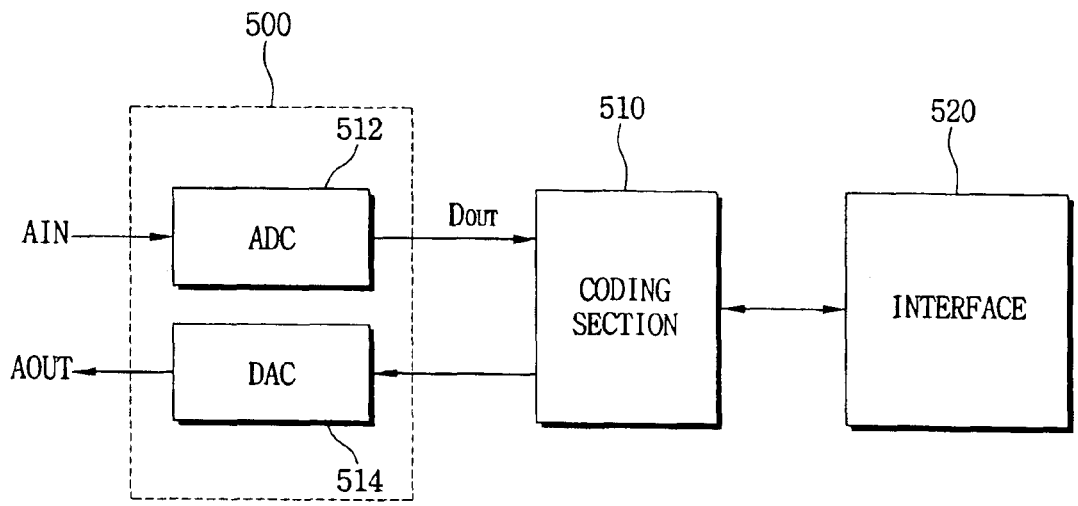
FIG. 5 is a schematic block diagram illustrating an exemplary audio processor of a mobile communication device, in accordance with the present invention.
Figure 6:
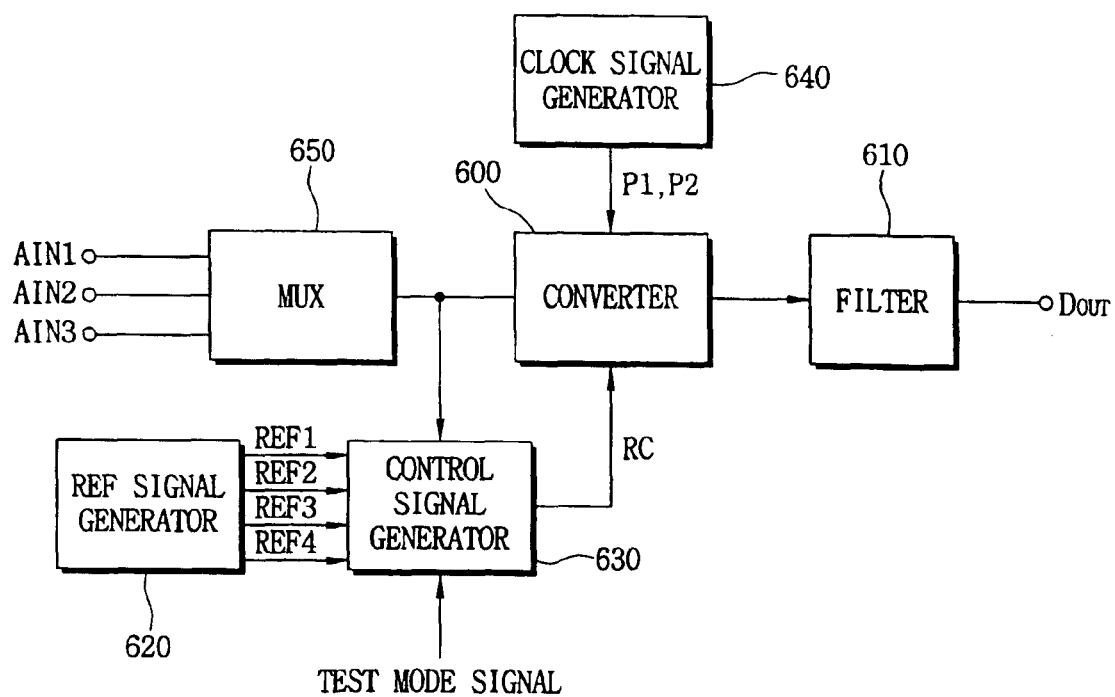
FIG. 6 is a schematic block diagram illustrating an exemplary analog-to-digital converter in FIG. 5 in accordance with the present invention.
Figure 7:
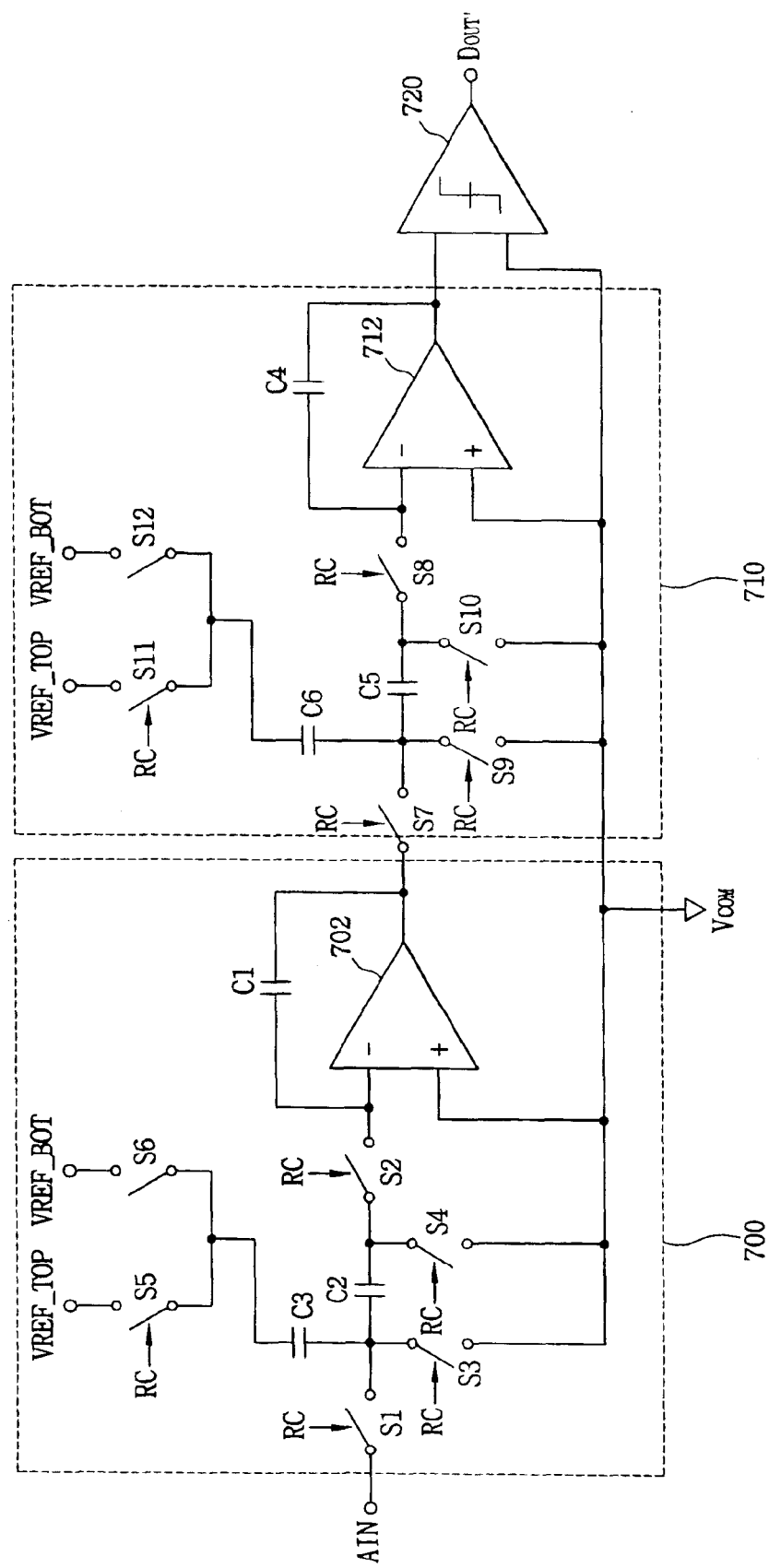
FIG. 7 is a schematic block diagram illustrating an exemplary analog sigma-delta modulator in accordance with the present invention.
Figure 8:
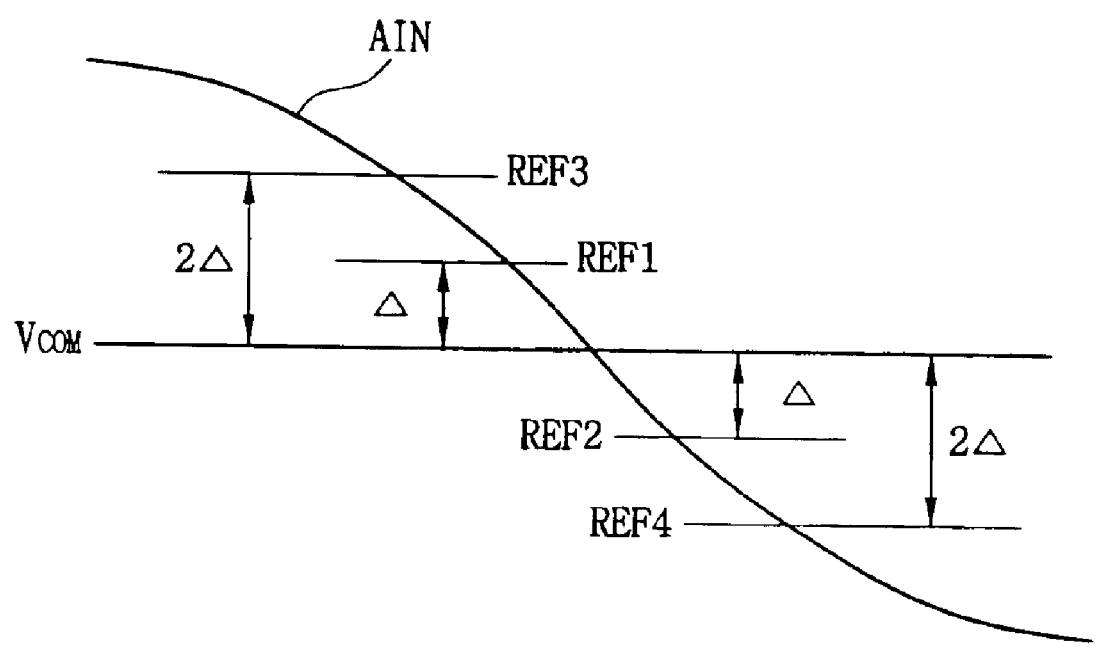
FIG. 8 is a graph showing exemplary reference signals generated from a reference signal generator of FIG. 6 in accordance with the present invention.
Figure 9:
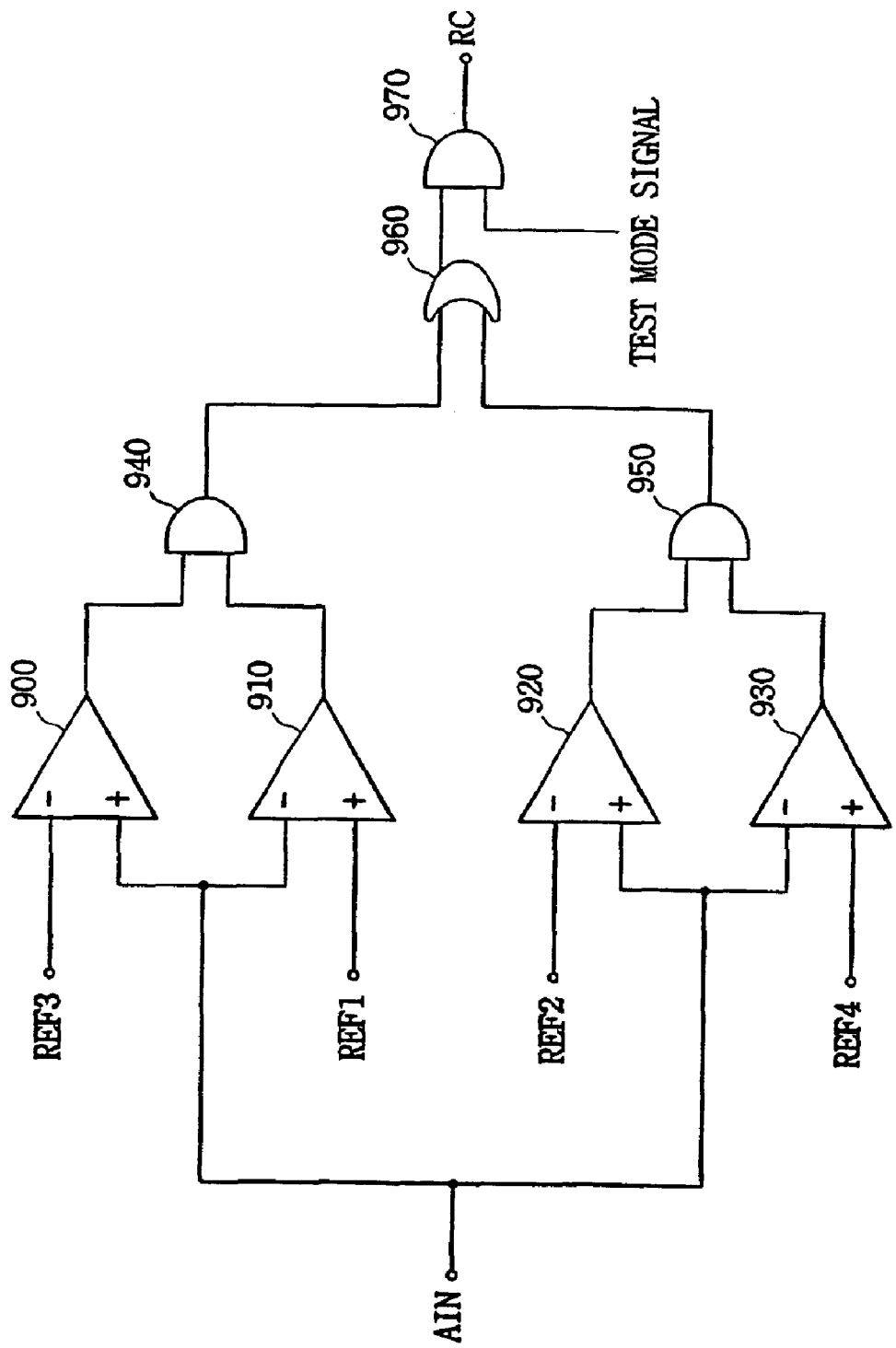
FIG. 9 is a schematic block diagram illustrating an exemplary switch control section of FIG. 6 in accordance with the present invention.

FIG. 5 is a schematic block diagram showing an exemplary audio processor of a mobile communication device in accordance with the present invention. FIG. 6 is a schematic block diagram showing an exemplary analog-to-digital converter of FIG. 5. FIG. 7 is a schematic block diagram showing an exemplary analog sigma-delta modulator of FIG. 6. FIG. 8 is a graph showing exemplary reference signals generated from a reference signal generator of FIG. 6. FIG. 9 is a schematic block diagram showing an exemplary switch control section of FIG. 6.

As shown in FIG. 5, the audio processor of a mobile communication device includes a voice codec 500, a coding section 510 and an interface 520.

The voice codec 500 converts an analog signal (AIN) inputted through a microphone (not shown) into a digital signal (DOUT), or converts a digital signal (DIN) into an analog signal (AOUT).

The coding section 510 encodes the digital signal (DOUT) and decodes the digital signal (DOUT) to output the decoded signal (DIN).

The interface 520 interfaces with an output of the coding section 510, and interfaces with an external signal inputted from external sources so that the external signal is outputted to the coding section 510.

The voice codec 500 includes an analog-to-digital converter (ADC) 512 for converting the analog signal (AIN) to the digital signal (DOUT) and a digital-to-analog converter (DAC) 514 for converting the digital signal (DIN) to the analog signal (AOUT).

Referring to FIG. 6, the ADC converter 512 includes a converter 600, a filter 610, a reference signal generator 620, a control signal generator 630 and a clock signal generator 640. For example, the converter 600 may include an analog sigma-delta modulator.

The converter 600, for example, an analog sigma-delta modulator, integrates first, second and third analog signals (AIN1, AIN2, AIN3) selectively outputted from a multiplexer (MUX) 650, and outputs a digital signal corresponding to the integrated analog signals (AIN1, AIN2, AIN3).

The analog sigma-delta modulator 600 includes, as shown in FIG. 7, a first switched capacitor integrator 700, a second switched capacitor integrator 710 and a comparator 720.

The first switched capacitor integrator 700 integrates an analog signal (AIN) inputted from an external source. The second switched capacitor integrator 710 integrates the output of the first switched capacitor integrator 700. The comparator 720 converts the output of the second switched capacitor integrator 710 to a digital signal corresponding to the integrated analog signals output from the second switched capacitor integrator 710.

The first switched capacitor integrator 700 includes a first operational amplifier (op amp) 702, a plurality of capacitive elements, for example capacitors C1, C2, C3, and a plurality of switches S1, S2, S3, S4, S5, S6.

A first capacitor C1 is connected to an inverting (−) terminal and an output terminal of the first operational amplifier 702. The second capacitor C2 is connected to the inverting (−) terminal of the first operational amplifier 702 through switch S2. First and second switches S1 and S2 are serially connected to first and second ends, respectively, of the second capacitor C2. A third switch S3 is connected to a first end of the second capacitor C2, and a fourth switch S4 is connected to a second end of the second capacitor C2. Fifth and sixth switches S5 and S6 switches a VREF_TOP or VREF_BOT signals so that the VREF_TOP or VREF_BOT signals may be fed back to the first switched capacitor integrator 700. The VREF_TOP or VREF_BOT signal is selected by the comparator 720. The third capacitor C3 is connected to the second capacitor C2. The non-inverting (+) terminal of the first operational amplifier 702 is connected to a DC reference voltage Vcom. The DC reference voltage Vcom is a ground level of the analog signal AIN, as shown in FIG. 8.

The switches S1, S2, S3 and S4 are turned on/off in response to the first and second clock signals P1 and P2 in a normal operation mode. In the active period of the first clock signal P1, the switches S1 and S4 are turned on, so that the analog signal AIN is charged in the second capacitor C2. In the active period of the second clock signal P2, the switches S2 and S3 are turned on, so that the charges accumulated in the second capacitor C2 are applied to the inverting (−) terminal of the first operational amplifier 702 and are amplified by the first operational amplifier 702.

The switches S1, S2, S3 and S4 are operated in response to a control signal (RC) outputted from the control signal generator 630 in an earlier or previous part of the test mode. Particularly, the switches S1, S2, S3 and S4 are turned on in response to the control signal (RC), the first and second capacitors C1 and C2 are electrically connected to the DC reference voltage Vcom, and the charges accumulated in the first and second capacitors C1 and C2 are discharged. The fifth switch S5 is turned on and the charges accumulated in the third capacitor C3 are discharged. The sixth switch S6 maintains a turn-on state. Here, the input terminal of the analog sigma-delta modulator 600 maintains a hold state, or cuts off the analog signal inputted from an external source.

After the capacitors C1, C2 and C3 are discharged in accordance with the states of the switches S1, S2, S3, S4 and S5 being turned on, the switches S1, S2, S3, S4, S5 and S6 are operated in response to the first and second clock signals P1 and P2, so that the analog signal (AIN) is first integrated and outputted to the second switched capacitor integrator 710.

The second switched capacitor integrator 710 includes a second operational amplifier (op amp) 712, a plurality of capacitive elements, for example, capacitors C4, C5, C6, and a plurality of switches S7, S8, S9, S10, S11, S12.

A fourth capacitor C4 is connected to an inverting (−) terminal and an output terminal of the second operational amplifier 712. A fifth capacitor C5 is connected to the inverting (−) terminal of the second operational amplifier 712 through switch S8. Fifth and sixth switches S5 and S6 are serially connected to first and second ends, respectively, of the fifth capacitor C5. A ninth switch S9 is connected to the first end of the fifth capacitor C5, and a tenth switch S10 is connected to the second end of the fifth capacitor C5. The sixth capacitor C6 is connected to the fifth capacitor C5. Eleventh and twelfth switches S11 and S12 switch the VREF_TOP or VREF_BOT signal so that the VREF_TOP or VREF_BOT signal may be fed back to the second switched capacitor integrator 710. The VREF_TOP or VREF_BOT signal is selected by the comparator 720. The non-inverting (+) terminal of the second operational amplifier 712 is connected to the DC reference voltage Vcom.

The switches S7, S8, S9, S10, S11 and S12 are operated in the same manner as the switches S1, S2, S3, S4, S5 and S6. The switches S7 and S10, in the normal operation mode and in the active period of the first clock signal P1, are turned on, so that the charges outputted from the first operational amplifier 702 are charged in the fifth capacitor C5. In the active period of the second clock signal P2, the switches S8 and S9 are turned on, so that the charges accumulated in the fifth capacitor C5 are applied to the inverting (−) terminal of the second operational amplifier 712 and are amplified by the second operational amplifier 712.

The switches S7, S8, S9 and S10 are operated in response to the control signal (RC) outputted from the control signal generator 630 in an earlier or previous part of the test mode.

Particularly, the switches S7, S8, S9 and S10 are turned on in response to the control signal (RC), the fourth and fifth capacitors C4 and C5 are electrically connected to the DC reference voltage Vcom, and the charges accumulated in the fourth and fifth capacitors C4 and C5 are discharged. The eleventh switch S11 is turned on and the charges accumulated in the sixth capacitor C6 are discharged. The twelfth switch S12 maintains a turn-on state. After the capacitors C4, C5 and C6 are discharged in accordance with the states of the switches S7, S8, S9, S10 and S11 being turned on in response to the control signal (RC), the switches S7, S8, S9, S10, S11 and S12 are operated in response to the first and second clock signals P1 and P2, so that the analog signal outputted from the first switched capacitor integrator 700 is secondly integrated and is outputted to the comparator 720.

The comparator 720 compares the secondly integrated analog signal (or the output of the second switched capacitor integrator 710) with a predetermined reference signal, outputs a digital signal (DOUT') corresponding to the secondly integrated analog signal, and simultaneously allows the VREF_TOP or VREF_BOT to be applied to the analog sigma-delta modulator 600. The switches S5 and S6 are turned on in response to the control signal (RC) to discharge the capacitors C3 and C6, and switches S6 and S12 maintain turn-off states.

The filter 610 filters the digital signal DOUT' outputted from the analog sigma-delta modulator 600 to remove the noise in the digital signal DOUT'. The reference signal generator 620 generates reference signals for determining the point of time when a level of the analog signal (AIN) is higher than a threshold level ($\Delta$).

For example, referring to FIG 8, the reference signals include four reference signals such as first, second, third and fourth reference signals. The first reference signal (REF1) has a first level higher than the DC reference voltage Vcom by the threshold level ($\Delta$). The DC reference voltage Vcom corresponds to the ground level of the analog signal (AIN). The second reference signal (REF2) has a second level lower than the DC reference voltage Vcom by the threshold level ($\Delta$). The third reference signal (REF3) has a third level higher than the DC reference voltage Vcom by two threshold levels ($2\Delta$). The fourth reference signal (REF4) has a fourth level lower than the DC reference voltage Vcom by two threshold levels ($2\Delta$).

When a test mode signal (or test request signal) is inputted into the control signal generator 630, the control signal generator 630 compares the reference signals (REF1, REF2, REF3 and REF4) with the analog signal (AIN). The control signal generator 630 outputs the control signal (RC) for turning on the switches S1, S2, S3, S4, S5, S6, S7, S8, S9, S10, S11 and S12 when the level of the analog signal (AIN) is higher than the threshold level ($\Delta$), and stops outputting the control signal (RC) when the level of the analog signal (AIN) is lower than or equal to the threshold level ($\Delta$).

Referring to FIG. 9, the control signal generator includes first, second, third and fourth comparators 900, 910, 920 and 930; first, second and third AND gates 940, 950 and 970 and an OR gate 960.

The third reference signal REF3 is inputted into an inverting (−) terminal of the first comparator 900, and the analog signal (AIN) is inputted to a non-inverting (+) terminal of the first comparator 900. The first reference signal REF1 is inputted into a non-inverting (+) terminal of the second comparator 910, and the analog signal (AIN) is inputted into an inverting (−) terminal of the second comparator 910. The second reference signal REF2 is inputted into an inverting (−) terminal of the third comparator 920, and the analog signal (AIN) is inputted to a non-inverting (+) terminal of the third comparator 920. The fourth reference signal REF4 is inputted into a non-inverting (+) terminal of the fourth comparator 930, and the analog signal (AIN) is inputted into an inverting (−) terminal of the fourth comparator 930. The first AND gate 940 performs a logical AND operation on outputs of the first and second comparators 900 and 910. The second AND gate 950 performs the logical AND operation on outputs of the third and fourth comparators 920 and 930. The OR gate 960 performs a logical OR operation on outputs of the first and second AND gates 940 and 950. The third AND gate 970 performs the logical AND operation on an output of the OR gate 960 and the test mode signal to output the control signal RC.

Hereinafter, the operation of the control signal generator 630 will be described.

Firstly, the first and second comparators 900 and 910 output a high level signal when the level of the analog signal (AIN) is between REF1 and REF3 (REF1<AIN<REF3), the first AND gate 940 outputs a high level signal, and the OR gate 960 outputs a high level signal. The third AND gate 970 outputs the control signal (rc) when the OR gate 960 outputs the high level signal and the test mode signal is inputted into the third AND gate 970.

The second comparators 910 outputs a low level signal when the level of the analog signal (AIN) is lower than REF1 (REF1>AIN), the first AND gate 940 outputs a low level signal, and the OR gate 960 outputs a low level signal. Thus, the third AND gate 970 does not output the control signal (RC).

Therefore, the control signal generator 630 outputs the control signal (RC) when the level of the analog signal (AIN) is between REF1 and REF3 (REF1<AIN<REF3), and stops outputting the control signal (RC) when the level of the analog signal (AIN) is lower than REF1 (REF1>AIN).

The third and fourth comparators 920 and 930 output high level signal when the level of the analog signal (AIN) is between REF2 and REF4 (REF4<AIN<REF4), the second AND gate 950 outputs high level signal, and the OR gate 960 outputs a high level signal. The third AND gate 970 outputs the control signal (RC) when the OR gate 960 outputs a high level signal and the test mode signal is inputted into the third AND gate 970.

The third and fourth comparators 920 and 930 output low level signals when the level of the analog signal (AIN) is higher than REF2 (REF2<AIN), the first AND gate 940 outputs a low level signal, and the OR gate 960 outputs a low level signal. Thus, the third AND gate 970 does not output the control signal (RC).

Therefore, the control signal generator 630 outputs the control signal (RC) when the level of the analog signal (AIN) is between REF2 and REF4 (REF4<AIN<REF2), and stops outputting the control signal (RC) when the level of the analog signal (AIN) is higher than REF2 (REF2>AIN).

The control signal generator 630, in the earlier part of the test mode, outputs the control signal (RC) when the level of the analog signal (AIN) is higher than the threshold level ($\Delta$). Particularly, for example, the control signal generator 630, in the earlier part of the test mode, may output the control signal (RC) when the level of the analog signal (AIN) is between REF1 and REF3 (REF1<AIN<REF3), or between REF2 and REF4 (REF4<AIN<REF2).

The control signal generator 630 stops outputting the control signal (RC) when the level of the analog signal (AIN) is lower than or equal to the threshold level that includes the ground level (Vcom). For example, the control signal generator 630 may stop outputting the control signal (rc) when the level of the analog signal (AIN) is between REF2 and REF1 (REF2<AIN<REF1).

The clock generator 640 provides the analog sigma-delta modulator 600 with the first and second clock signals P1 and P2 when the capacitors C1, C2, C3, C4, C5 and C6 of the analog sigma-delta modulator 600 are discharged.

When a second analog signal (AIN2) is inputted into the control signal generator 630 after the test operation performed using the first analog signal (AIN1), the switches S1, S2, S3, S4, S5, S6, S7, S8, S9, S10, S11 and S12 are operated in response to the control signal (rc) to discharge the capacitor C1, C2, C3, C4, C5 and C6. After the capacitor C1, C2, C3, C4, C5 and C6 are discharged, and the switches S1, S2, S3, S4, S5, S6, S7, S8, S9, S10, S11 and S12 are turned on/off in response to the first and second clock signals P1 and P2 to perform the test operation.

In addition, the capacitor C1, C2, C3, C4, C5 and C6 are discharged when the level of the second analog signal (AIN2) is higher than the threshold level ($\Delta$), i.e. AIN2>REF3 or AIN2<REF2, and the control signal generator 630 stops outputting the control signal (rc) when the level of the analog signal (AIN2) is lower than or equal to the threshold level ($\Delta$), i.e. REF2<AIN<REF1, to perform the test operation.

One example mobile communication device having the above video codec receives three audio signals from a microphone, an ear speaker and microphone used in a handsfree handset.

Hereinafter, the test mode operation of the control signal generator 630 will be described.

When a test audio signal is inputted to a microphone, the switches S1, S2, S3, S4, S5, S6, S7, S8, S9, S10, S11 and S12 are turned on/off in response to the first and second clock signals P1 and P2, and thus the analog sigma-delta modulator 600 converts the test audio signal outputted from the microphone to a digital signal. The analog sigma-delta modulator 600 compares the digital signal outputted therefrom with a predetermined signal so as to determine the operational status of the audio signal processor.

When a test audio signal is inputted into an ear speaker after the test operation using the microphone is completed, the switches S1, S2, S3, S4, S5, S6, S7, S8, S9, S10, S11 and S12 are turned on/off in response to the control signal (RC) outputted from the control signal generator 630 to discharge the charge accumulated in the capacitors C1, C2, C3, C4, C5 and C6 during the test operation using the microphone.

After the capacitors C1, C2, C3, C4, C5 and C6 are discharged, the switches S1, S2, S3, S4, S5, S6, S7, S8, S9, S10, S11 and S12 are turned on/off in response to the first and second clock signals P1 and P2, and thus the analog sigma-delta modulator 600 converts the test audio signal outputted from the ear speaker to a digital signal. The analog sigma-delta modulator 600 compares the digital signal outputted therefrom with a predetermined signal so as to determine the operational status of the audio signal processor.

Figure 10:
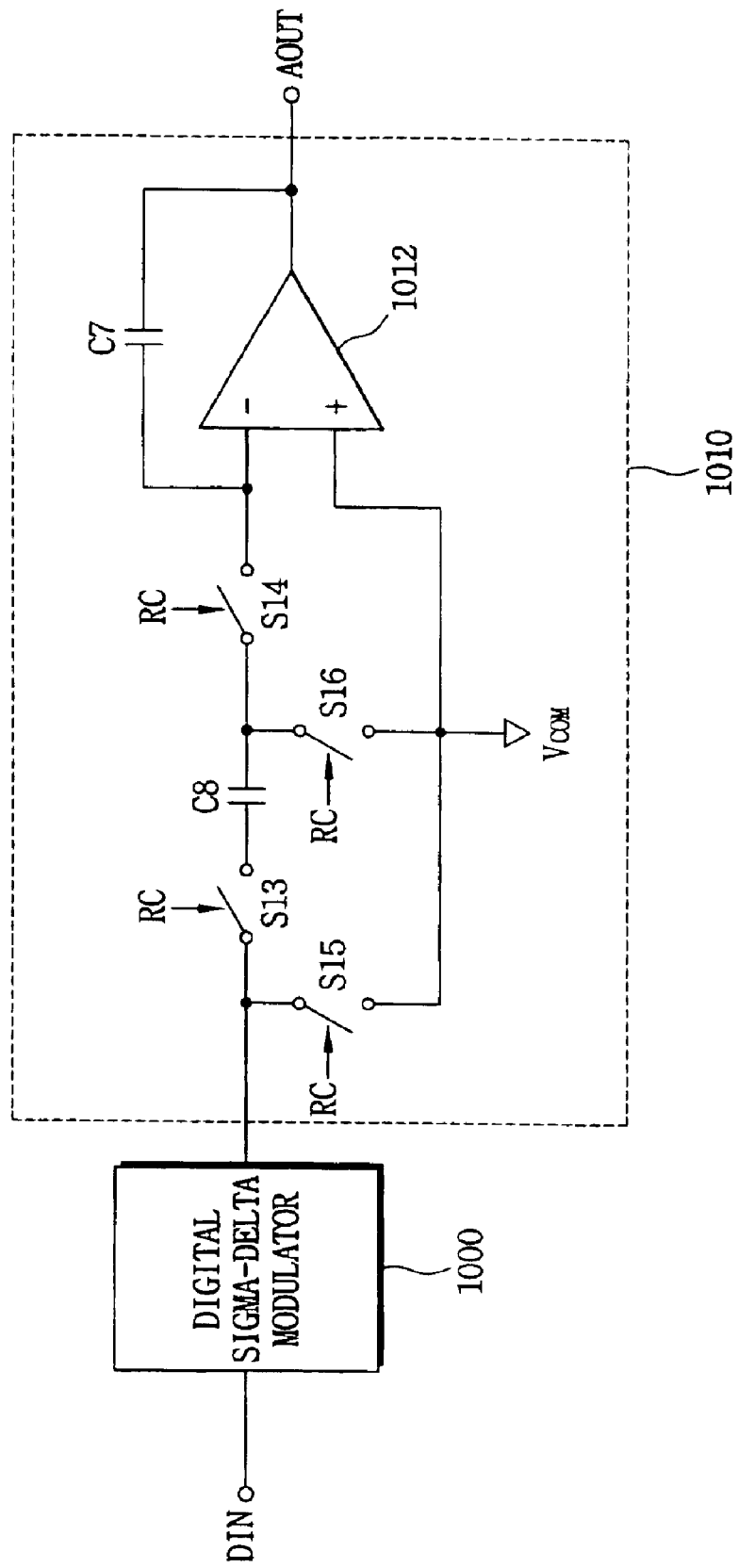
FIG. 10 is a schematic block diagram illustrating an exemplary digital-to-analog converter of FIG. 5 in accordance with the invention.

FIG. 10 is a block diagram showing an exemplary digital-to-analog converter (DAC) 514 of FIG. 5.

Referring to FIG. 10, the DAC 514 includes a digital sigma-delta modulator 1000 and an analog filter 1010.

The digital sigma-delta modulator 1000 converts a digital signal DIN to an analog signal, and the analog filter 1010 filters the analog signal outputted from the digital sigma-delta modulator 1000.

The analog filter 1010 includes a third operational amplifier 1012, a plurality of capacitive elements, for example, capacitors C7, C8, and a plurality of switches S13, S14, S15, S16.

A seventh capacitor C7 is connected to an inverting (−) terminal and an output terminal of the third operational amplifier 1012. An eighth capacitor C2 is connected to an inverting (−) terminal of the third operational amplifier 1012 through switch S14. Thirteenth and fourteenth switches S13 and S14 are serially connected to first and second ends, respectively, of the eighth capacitor C8. A fifteenth switch S15 is connected to the first end of the eighth capacitor C8, and a sixteenth switch S16 is connected to the second end of the eighth capacitor C8. The non-inverting (+) terminal of the third operational amplifier 1012 is connected to the DC reference voltage Vcom.

The switches S13, S14, S15 and S16 are turned on in response to the control signal outputted from the control signal generator 630 during the test mode. The seventh and eighth capacitors C7 and C8 are electrically connected to the DC reference voltage Vcom in accordance with the states of the switches S15 and S16 being turned on, and the charges accumulated in the seventh and eighth capacitors C7 and C8 are discharged.

The analog filter 1010 discharges the charges accumulated in the capacitors C7 and C8 during the test operation using a previous audio signal, and performs the test operation of the audio signal processor when the level of the audio signal is lower than the threshold level (for example, $-\Delta$<AIN<$\Delta$).

Hereinafter, the method of testing the audio signal processor is described.

FIG. 11 is a flow chart showing an exemplary method of testing the audio processor.

First, the control signal generator 630 determines whether or not a test request signal (or a test mode signal) for testing the operational status of the signal processor is received. Particularly, the control signal generator 630 detects the test request signal so as to determine whether or not the ADC 512 is in the test mode (S1100). When the test request signal is received or the ADC 512 is in the test mode, the control signal generator 630 detects the analog signal AIN outputted from the analog sigma-delta modulator 600 (S1110). For example, the analog signal AIN is an audio signal for testing the operational status of the audio signal processor.

The control signal generator 630 compares the first, second, third and fourth reference signals REF1, REF2, REF3 and REF4 outputted from the reference signal generator 620 with the analog signal AIN to detect whether or not a level of the analog signal AIN is higher than a threshold level (S1120). Particularly, the control signal generator 630 detects whether the level of the analog signal AIN is higher than the threshold level ($\Delta$). Particularly, for example, the control signal generator 630 may detect whether the level of the analog signal AIN is between REF1 and REF3 (REF1<AIN<REF3), or between REF2 and REF4 (REF4<AIN<REF2).

The control signal generator 630 outputs the control signal (RC) so as to turn on the switches S1, S2, S3, S4, S5, S7, S8, S9, S10 and S11 when the level of the analog signal (AIN) is higher than the threshold level ($\Delta$) (S1130). When the switches S1, S2, S3, S4, S5, S7, S8, S9, S10 and S11 are turned on, the capacitors C1, C2, C3, C4, C5 and C6 are discharged.

The control signal generator 630 detects whether the level of the analog signal (AIN) is lower than or equal to the threshold level (Δ) that includes the ground level (Vcom) (S1140). For example, the control signal generator 630 detects the point of time when the level of the analog signal (AIN) is between REF2 and REF1 (REF2<AIN<REF1).

The control signal generator 630 stops outputting the control signal (RC) when the level of the analog signal (AIN) is lower than or equal to the threshold level (S1150), to thereby stop discharging the capacitors C1, C2, C3, C4, C5 and C6.

The switches S1, S2, S3, S4, S5, S6, S7, S8, S9, S10, S11 and S12 are operated in response to the first and second clock signals P1 and P2, the analog signal AIN is converted to a digital signal, and a predetermined signal corresponding to the analog signal is compared with the digital signal so as to test the operational status of the signal processor (S1160) using the first and second clock signals P1 and P2.

While the test operation is performed, a change of the test mode is detected (S1170). Particularly, the test mode is changed when another audio signal is outputted from another audio input device such as microphone, ear speaker, etc.

When the change of the test mode is detected, the flow of the procedure returns to step S1110.

The above testing method is performed in the ADC 512, and the DAC 514 may perform the above testing method as well.

Although above exemplary embodiments discuss audio signal processor, a video signal processor could also be tested in accordance with the above exemplary embodiments, or any other signal processing processor known to one of the ordinary skill in the art.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A signal processor comprising:
   a first converter for integrating a first analog signal to output a first digital signal corresponding to the integrated first analog signal, the first converter including a plurality of switches and a plurality of capacitive elements coupled to the switches, the switches being switched in response to at least one clock signal;
   a first filter, coupled to the first converter, for filtering the first digital signal;
   a control section for providing the first converter with a control signal for discharging the capacitive elements when a test mode signal is received;
   a second converter for converting a second digital signal into a second analog signal; and
   a second filter, coupled to the second converter, for filtering the second analog signal.

2. The signal processor of claim 1, wherein the first converter includes:
   a first integrator for integrating the first analog signal;
   a second integrator for integrating an output of the first integrator; and
   a comparator for converting an output of the second integrator to the first digital signal.

3. The signal processor of claim 2, wherein the first integrator includes:
   a first operational amplifier;
   a first capacitive element coupled to a first input terminal of the first operational amplifier and an output terminal of the first operational amplifier;
   a second capacitive element coupled to the first input terminal of the first operational amplifier;
   first and second switches, serially coupled to first and second ends, respectively, of the second capacitive element, the first and second switches being turned on in response to the control signal; and
   third and fourth switches, coupled in parallel to first and second ends, respectively, of the second capacitive element, the third and fourth switches being turned on in response to the control signal to discharge the first and second capacitive elements.

4. The signal processor of claim 3, wherein the second integrator includes:
   a second operational amplifier;
   a third capacitive element coupled to a first input terminal of the second operational amplifier and an output terminal of the second operational amplifier;
   a fourth capacitive element coupled to the first input terminal of the second operational amplifier;
   fifth and sixth switches serially coupled to first and second ends, respectively, of the fourth capacitive element, the fifth and sixth switches being turned on in response to the control signal; and
   seventh and eighth switches coupled in parallel to first and second ends, respectively, of the fourth capacitive element, the seventh and eighth switches being turned on in response to the control signal to discharge the third and fourth capacitive elements.

5. The signal processor of claim 1, wherein the control section includes:
   a reference signal generator for generating at least one reference signal that has a predetermined amplitude with respect to a ground level of the first analog signal; and
   a control signal generator for comparing the reference signal with the first analog signal to output the control signal when a level of the first analog signal is higher than a threshold level, and to stop outputting the control signal when the level of the first analog signal is lower than or equal to the threshold level.

6. The signal processor of claim 5, wherein said at least one reference signal includes:
   a first reference signal having a first level higher than a DC reference voltage by the threshold level, the DC reference voltage corresponding to the ground level of the first analog signal;
   a second reference signal having a second level higher than the first reference signal by the threshold level;
   a third reference signal having a third level lower than the DC reference voltage by the threshold level; and
   a fourth reference signal having a fourth level lower than the third reference signal by the threshold level.

7. The signal processor of claim 6, wherein the control signal generator includes:
   a first comparator having a first input terminal through which the second reference signal is inputted, and a second input terminal through which the first analog signal is inputted;
   a second comparator having a second input terminal through which the first reference signal is inputted and a first input terminal through which the first analog signal is inputted;

a third comparator having a second input terminal through which the fourth reference signal is inputted and a first input terminal through which the first analog signal is inputted;

a fourth comparator having a first input terminal through which the third reference signal is inputted and a second input terminal through which the first analog signal is inputted;

a first AND gate for performing a logical AND operation on outputs of the first and second comparators;

a second AND gate for performing the logical AND operation on outputs of the third and fourth comparators;

an OR gate for performing a logical OR operation on outputs of the first and second AND gates; and a third AND gate for performing the logical AND operation on an output of the OR gate and the test mode signal to output the control signal.

8. The signal processor of claim 1, wherein the second filter includes:

an operational amplifier;

a first capacitive element coupled to a first input terminal of the operational amplifier and an output terminal of the operational amplifier;

a second capacitive element coupled to the first input terminal of the operational amplifier;

first and second switches serially coupled to first and second ends, respectively, of the second capacitive element, the first and second switches being turned on in response to the control signal; and third and fourth switches coupled in parallel to first and second ends, respectively, of the second capacitive element, the third and fourth switches being turned on in response to the control signal to discharge the first and second capacitive elements.

9. The signal processor of claim 1, further comprising a clock signal generator for providing the first converter with first and second clock signals when the control signal is not provided to the first converter, the first clock signal selectively turning on first switches of the switches to charge at least one of the capacitive elements, and the second clock signal selectively turning on second switches of the switches to amplify charges of the capacitive elements.

10. A method of testing a signal processor including a plurality of switches and a plurality of capacitive elements coupled to the switches, the method comprising:

determining whether a test request signal for testing the operational status of the signal processor is received;

discharging the capacitive elements when the test request signal is received; and testing the operational status of the signal processor using an analog signal; wherein the testing includes:

converting the analog signal into a digital signal using the switches and the capacitive elements operated in response to first and second clock signals; and comparing a predetermined signal corresponding to the analog signal with the digital signal to test the operational status of the signal processor.

11. The method of claim 10, wherein the capacitive elements are discharged by:

detecting whether a level of the analog signal is higher than a threshold level; discharging the capacitive elements when the level of the analog signal is higher than the threshold level; and stopping discharging the capacitive elements when the analog signal is lower than or equal to the threshold level.

12. An apparatus for testing a signal processor including a plurality of switches and a plurality of capacitive elements operated in response to at least one clock signal, the signal processor converting a first analog signal to a first digital signal or converting a second digital signal to a second analog signal, the apparatus comprising:

a reference signal generator for generating at least one reference signal that has a predetermined amplitude with respect to a ground level of the first analog signal; and a control signal generator for comparing the reference signal with the first analog signal to output a control signal when a level of the first analog signal is higher than a threshold level, and to stop outputting the control signal when the level of the first analog signal is lower than or equal to the threshold level, wherein the switches are operated in response to the control signal so that the capacitive elements are discharged in response to the control signal; wherein:

the reference signal includes:

a first reference signal having a first level higher than a DC reference voltage by the threshold level, the DC reference voltage corresponding to the ground level of the first analog signal, a second reference signal having a second level higher than the first reference signal by the threshold level, a third reference signal having a third level lower than the DC reference voltage by the threshold level, and a fourth reference signal having a fourth level lower than the third reference signal by the threshold level; and the control signal generator includes:

a first comparator having a first input terminal through which the second reference signal is inputted and a second input terminal through which the first analog signal is inputted, a second comparator having a second input terminal through which the first reference signal is inputted and a first input terminal through which the first analog signal is inputted, a third comparator having a second input terminal through which the fourth reference signal is inputted and a first input terminal through which the first analog signal is inputted, a fourth comparator having a first input terminal through which the third reference signal is inputted and a second input terminal through which the first analog signal is inputted, a first AND gate for performing a logical AND operation on outputs of the first and second comparators, a second AND gate for performing the logical AND operation on outputs of the third and fourth comparators, an OR gate for performing a logical OR operation on outputs of the first and second AND gates, and a third AND gate for performing the logical AND operation on an output of the OR gate and the test mode signal to output the control signal.

* * * * *